United States Patent [19]

Shoshani

[11] Patent Number: 4,869,940
[45] Date of Patent: Sep. 26, 1989

[54] DECORATIVE PRODUCTS MADE OF PLASTIC HAVING A METALIC DECORATIVE PATTERN

[76] Inventor: Uri Shoshani, 49 Morad Hanahal Street, Hofit, Israel

[21] Appl. No.: 139,947

[22] Filed: Dec. 31, 1987

[30] Foreign Application Priority Data

Jan. 5, 1987 [IL] Israel ........................................ 81157

[51] Int. Cl.⁴ .............................................. B44F 1/06
[52] U.S. Cl. .................................... 428/38; 428/34.5; 428/35.8; 428/138; 430/295; 430/323
[58] Field of Search ............... 430/295, 320, 323, 329; 428/901, 138, 34.5, 35.8, 38

[56] References Cited

U.S. PATENT DOCUMENTS

| | | | |
|---|---|---|---|
| 3,477,900 | 11/1969 | Soukup | 428/901 X |
| 3,499,781 | 3/1970 | Krueckel | 430/295 |
| 3,959,527 | 5/1976 | Droege | 430/323 X |
| 4,115,185 | 9/1978 | Carlson et al. | 428/901 X |
| 4,404,569 | 9/1983 | Neumann et al. | 428/901 X |
| 4,483,917 | 11/1984 | Archer et al. | 430/329 |
| 4,599,297 | 7/1986 | Yazaki et al. | 430/329 X |
| 4,666,818 | 5/1987 | Lake et al. | 430/329 X |

*Primary Examiner*—Henry F. Epstein
*Attorney, Agent, or Firm*—Brumbaugh, Graves, Donohue & Raymond

[57] ABSTRACT

There are disclosed decorative products such as lampshades, vitrages, or wall and table ornaments made of plastic material and having a decorative pattern made of metal bonded to the plastic, wherein the thickness of the metal bonded to the plastic is uniform.

7 Claims, 2 Drawing Sheets

Fig. 1
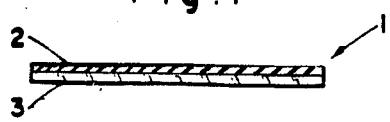
Fig. 1 A'
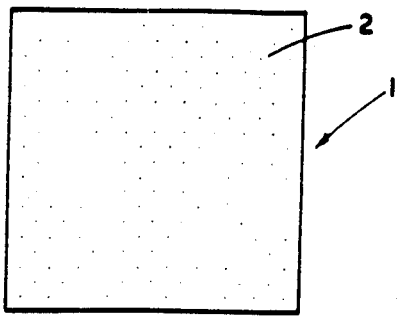
Fig. 1 A
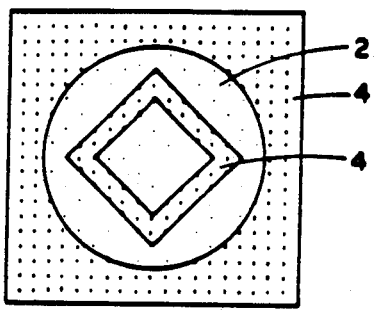
Fig. 1 B
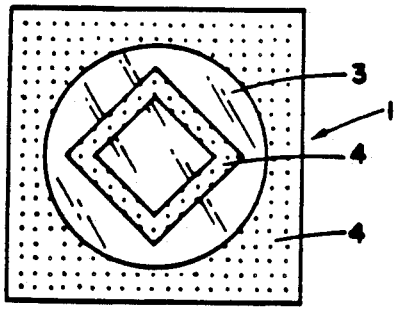
Fig. 1 C
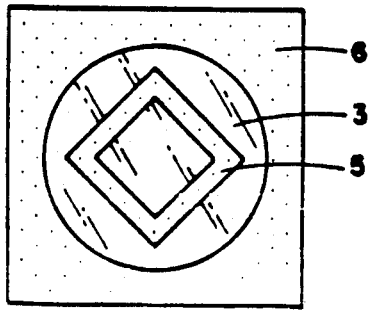
Fig. 1 D

DECORATIVE PRODUCTS MADE OF PLASTIC HAVING A METALIC DECORATIVE PATTERN

The present invention relates to novel, useful decorative products such as lampshades, stained glass-like window and the like. More particularly the invention relates to products made of plastic, having a decorative pattern of metal bonded to the plastic.

It is the object of the present invention to provide for novel decorative products made of relatively inexpensive materials applying relatively simple processing techniques.

It is a further object of the invention to provide for methods of producing the decorative products of the invention.

Thus in accordance with the present invention there are provided decorative products made of plastic material having a decorative pattern made of metal bonded to the plastic, wherein the thickness of the metal bonded to the plastic is uniform. The decorative products according to the invention can be used as lampshades, stained glass-like window, wall and table ornaments, screens and the like.

When the decorative products are used as lampshades or vitrages, it is required that the plastic material they are made of, is transparent to light. For other uses where no light permeability is required, such as for wall ornaments, opaque plastic material could also be used.

Preferably the plastic materials of the decorative products of the invention are made of reinforced plastic laminates. Examples of reinforced plastic laminates to be used in the decorative products of the invention are epoxy resins reinforced with glass fibre, epoxy laminates with composite reinforcement, polyimide glass fabric, triazine laminates with glass fabric reinforcement, and phenol-formaldehyde resins impregnated with paper.

All metals, which can be processed into thin sheets, be bonded to plastic laminates and form attractive design, are suitable. Examples for metals bonded to plastic laminate in the decorative products of the invention are copper, aluminum, or stainless steel.

In accordance with the present invention the decorative products of the invention are produced from a sheet of metal foil bonded to a plastic laminate. The decorative pattern on the decorative products is obtained by removing certain parts of the metal from the foil bound to the plastic laminate.

Examples of commercial metal clad laminates suitable as raw material for the decorative products of the invention are NORPLEX laminates manufactured by UOP Inc., or PHENOSEF and ALUSEF manufactured by SEFOLAM.

The thickness of the plastic sheet and the metal sheet bound thereto can vary according to the specification of the product. Common commercial metal clad laminates are available with laminate thickness ranging between 0.1 mm to 4 mm and copper thickness ranging between 17 microns to 105 microns. However, other thickness of metal sheet or plastic laminate suitable for producing decorative products according to the invention, are also within the range according to the present invention.

The parts to be removed are chosen according to the required design, so that the metal remaining bound to the plastic surface forms the required design. The removal of the metal is carried out by any method of treatment of metal which does not affect the plastic laminate.

In accordance with one embodiment of the invention the decorative products are obtained by engraving the metal surface and removing certain areas therefrom according to the required design, applying a mechanical, electrical or hand chisel.

In accordance with another embodiment of the invention the decorative products are obtained by selectively burning the metal surface according to the required design, applying a laser beam.

In accordance with yet another embodiment of the invention the decorative products are obtained by selectively coating the metal surface of the metal clad laminate by a protective material, not affected by etching solutions, subsequently, dissolving the uncoated metal surface by an appropriate etching solution, such as an hydrochloric acid, nitric acid or ferric chloride solution, and finally, if required, removing the protective material to expose a metalic decorative pattern bonded to the plastic laminate. If the protective material is transparent, the last stage of removing the protective material can be omitted.

The selective coating of certain areas of the metal is done by any known method, such as by hand painting of the protective coating on the metal surface, by printing the required design on the metal surface using a printing material which withstands the etching solution, or by using a photographic method.

Thus in accordance with one embodiment of the invention the decorative pattern on the products of the invention is produced by the following steps:
(a) Coating the metal surface of the metal clad laminate with a photosensitive emulsion or film;
(b) Superimposing a photographic negative of the required pattern on the photo sensitive coating;
(c) Exposing the photosensitive coating to U.V. light to produce a photographic positive;
(d) removing the unprotected metal areas by acid treatment; and
(e) Optionally removing the hardened photosensitive coating.

Protective coating suitable for painting the required design on the metal surface are for example, waxes, asphalts, oil crayons, lacquers or varnishes.

When printing the required design, printing can be carried out by any known printing technique, such as hand printing, silk screening and the like.

BRIEF DESCRIPTION OF THE DRAWINGS

The invention is further illustrated by way of example only, with reference to the accompanying drawings in which:

FIGS. 1A' and A to D show stages in the production of a decorative pattern for a decorative product from a copper sheet bound to a transparent sheet.

Figure 2:
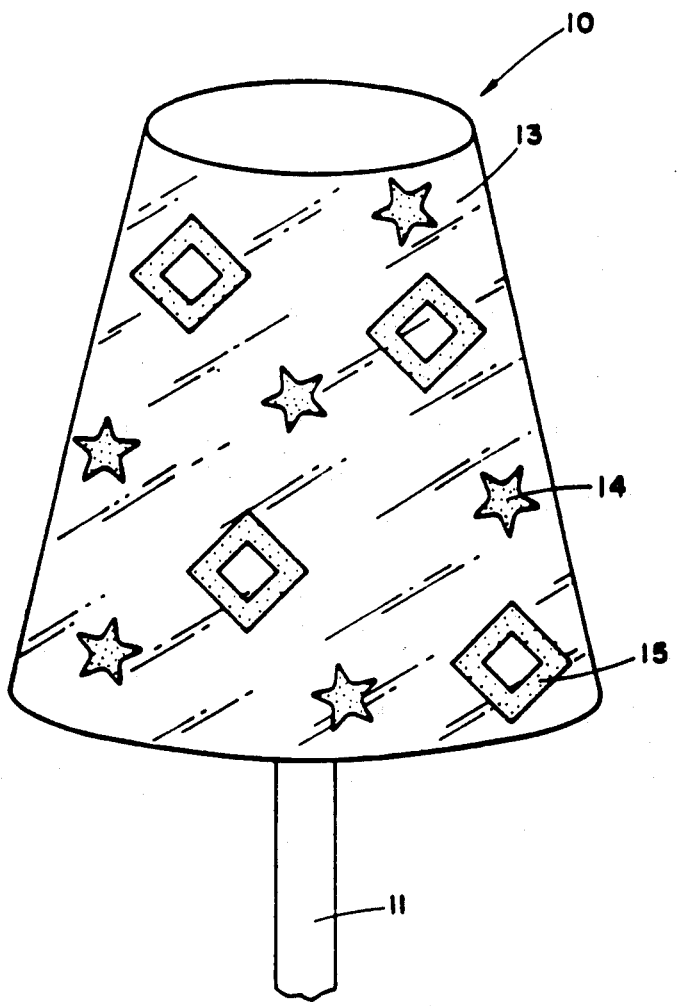
FIG. 2 is a side view of a lamp having a decorative pattern according to the invention.

A and A' in FIG. 1 are top view and side view respectively of the raw material used in producing a decorative products of the invention. Thus the raw material is a copper clad laminate 1 made of a thin copper sheet 2 bound to epoxy/glass fabric laminate 3.

Stage B represents the first step in producing the decorative product, wherein the required copper design to be obtained on the final product (i.e. the central empty square shape and the round frame) is painted on the surface of copper sheet 2 and covered with wax coating 4, which serves as the protective coating.

Stage C shows copper clad laminate 1 of stage B after it was exposed to an etching solution of 20% nitric acid. The treatment with the etching solution does not affect wax coating 4, but removes those parts of the copper sheet which are uncovered with wax, to expose the transparent epoxy/glass fabric laminate 3.

Stage D shows the final product obtained after removal of wax coating 4 from the product of stage C, with the metal decorative design in a shape of an empty square 5 and a round frame 6, bonded to transparent epoxy/glass fabric laminate 3.

In FIG. 2 a decorative lampshade 10, having the shape of a truncated cone is shown. The transparent body of the lampshade 13 made of epoxy/glass fabric laminate enables the transfer of light from the illuminating lamp (not shown) attached to stand 11, and the decorative copper patterns in the shape of stars 14 and hollow square 15 serve as shiny metalic decorative design bonded to the lampshade.

I claim:

1. A light transmitting decorative product selected from the group consisting of lampshade, screen, partition and stained window comprising a transparent or translucent plastic laminate having a decorative pattern made of a metal foil bound to the plastic, wherein the thickness of the metal foil bound to the plastic is uniform, and said metal foil is absent from selected portions of the plastic laminate thereby creating a light transmitting product having a metallic decoration of uniform thickness.

2. Decorative product according to claim 1 wherein the plastic material is an epoxy resin reinforced with glass fibre fabric.

3. The method of producing a light transmitting decorative product made of transparent or translucent plastic laminate having a decorative pattern made of metal bound to the plastic wherein the product is produced from a sheet of metal foil bound to the plastic laminate comprising removing certain parts of the metal from said foil according to the required design.

4. A method of producing a decorative product according to claim 3 wherein the decorative pattern is obtained by engraving the metal foil according to the required design by applying a mechanical, electrical or hand chisel.

5. A method of producing a decorative product according to claim 3 wherein the decorative pattern is obtained by selectively burning away the metal foil according to the required design by applying a laser beam.

6. A method of producing a decorative product according to claim 3 wherein the decorative pattern is obtained by the following steps:
   (a) Coating selectively the metal foil outer surface by a protective material not affected by acid solution according to the required design;
   (b) Removing the uncoated metal surface by dissolving in an acid solution; and
   (c) Optionally removing said protective material to expose the metalic decorative pattern.

7. A method of producing a decorative product according to claim 3 wherein the decorative pattern is produced by the following steps:
   (a) Coating the outer surface of the metal foil bonded to the plastic laminate with a photosensitive emulsion or film;
   (b) Superimposing a photographic negative of the required pattern on the photosensitive coating;
   (c) Exposing the photosensitive coating to U.V. light to produce a photographic positive;
   (d) Removing the unprotected metal areas by acid treatment; and
   (e) Optionally removing the hardened photosensitive coating.

* * * * *